United States Patent
Lang et al.

(10) Patent No.: US 8,779,381 B2
(45) Date of Patent: Jul. 15, 2014

(54) APERTURE UNIT FOR A PARTICLE BEAM DEVICE

(75) Inventors: Matthias Lang, Mögglingen (DE);
Ulrike Zeile, Heidenheim (DE);
Michael Albiez, Aalen (DE); Wolfram Bühler, Hermaringen (DE)

(73) Assignee: Carl Zeiss NTS GmbH, Oberkochen (DE)

( * ) Notice: Subject to any disclaimer, the term of this patent is extended or adjusted under 35 U.S.C. 154(b) by 164 days.

(21) Appl. No.: 13/200,155

(22) Filed: Sep. 19, 2011

(65) Prior Publication Data

US 2012/0112089 A1 May 10, 2012

(30) Foreign Application Priority Data

Sep. 21, 2010 (DE) .................... 10 2010 041 156

(51) Int. Cl.
*H01J 27/00* (2006.01)
*H01J 3/14* (2006.01)

(52) U.S. Cl.
USPC .................................. 250/423 R; 250/396 R

(58) Field of Classification Search
CPC .......................................... H01J 2237/31749
USPC .................. 250/396 R, 423 R, 492.2, 492.22
See application file for complete search history.

(56) References Cited

U.S. PATENT DOCUMENTS

| | | | |
|---|---|---|---|
| 4,514,638 A | | 4/1985 | Lischke et al. |
| 5,235,239 A | * | 8/1993 | Jacob et al. ............ 313/363.1 |
| 6,498,345 B1 | | 12/2002 | Weimer et al. |
| 8,198,601 B2 | * | 6/2012 | Platzgummer et al. ... 250/396 R |
| 2005/0045834 A1 | * | 3/2005 | McGinn et al. ........... 250/423 R |
| 2005/0199820 A1 | | 9/2005 | Eastham |
| 2009/0026389 A1 | * | 1/2009 | Platzgummer ............. 250/492.2 |
| 2009/0050820 A1 | * | 2/2009 | Ikeda et al. ............... 250/396 R |
| 2010/0288938 A1 | * | 11/2010 | Platzgummer ............ 250/396 R |

FOREIGN PATENT DOCUMENTS

| | | |
|---|---|---|
| DE | 198 28 476 A1 | 12/1999 |
| DE | 698 28 501 T2 | 1/2006 |
| EP | 0 075 712 A2 | 4/1983 |
| EP | 0 917 178 A1 | 5/1999 |
| EP | 0 981 828 B1 | 1/2005 |
| EP | 1 780 761 B1 | 8/2008 |
| JP | 58158843 A | 9/1983 |
| JP | 2003-123659 A | 4/2003 |

OTHER PUBLICATIONS

Huette, *Das Ingenieurwissen* [Engineering], H. Czichas und M. Hennecke, 32nd ed., Berlin, Heidelberg, New York 2004, pp. B174 + B175, with translation, 10 pp.

(Continued)

*Primary Examiner* — Nikita Wells
*Assistant Examiner* — Johnnie L Smith
(74) *Attorney, Agent, or Firm* — Muirhead and Saturnelli, LLC

(57) ABSTRACT

An aperture unit for a particle beam device, in particular an electron beam device, is disclosed. Deposit supporting units are arranged at the aperture unit, with which deposit supporting units contaminations can be bound in such a way that the contaminations can no longer deposit at an aperture opening of the aperture unit. Coatings which can be arranged on the aperture unit make it possible to reduce interactions which cause contaminations to deposit at the aperture opening.

19 Claims, 9 Drawing Sheets

(56) References Cited

OTHER PUBLICATIONS

*CRC Handbook of Chemistry and Physics*, 88th ed, Boca Raton, London, New York 2007/2008, Section 12 (Properties of Solids), p. 12-119.

Bergmann Schaefer, *Lehrbuch der Experimentalphysik* [Textbook of Experimental Physics], vol. 2, "Elektro-Magnetismus", 8th edition, Berlin, New York 1999, pp. 513 to 515, with translation, 10 pp.

Mitutoyo, "Oberflaechenrauheitsmessung—Praktische Hinweise für Labor und Werkstatt" Surface Roughness Measurement—Practical tips for laboratory and workship, Neuss 2008, with translation, 9 pp.

Takeshi Iyasu et al., "Experimental Studies of Secondary Electron Emission of TiO2 and Ti," Japanese Journal of Applied Physics 45 (2006), pp. 7879-7880, Abstract, 1 p.

* cited by examiner

APERTURE UNIT FOR A PARTICLE BEAM DEVICE

TECHNICAL FIELD

This application relates to an aperture unit for a particle beam device, in particular an electron beam device. Furthermore, this application relates to a particle beam device comprising an aperture unit of this type.

BACKGROUND OF THE INVENTION

Electron beam devices, in particular a scanning electron microscope (SEM) or a transmission electron microscope (TEM), are used for examining samples in order to obtain knowledge concerning the properties and behavior of these samples under specific conditions.

In the case of an SEM, an electron beam (also called primary electron beam hereinafter) is generated using a beam generator and focused by a beam guiding system, in particular an objective lens, onto a sample to be examined (also called object hereinafter). Using a deflection device, the primary electron beam is guided in a raster-type fashion over a surface of the sample to be examined. In this case, the electrons of the primary electron beam interact with the material of the sample to be examined. Interaction particles, in particular, arise as a consequence of the interaction. By way of example, electrons are emitted by the sample to be examined (so-called secondary electrons) and electrons of the primary electron beam are backscattered at the sample to be examined (so-called backscattered electrons). The secondary electrons and backscattered electrons are detected and used for image generation. An imaging of the sample to be examined is thus obtained.

Furthermore, it is known from the prior art to use combination devices for examining samples, in which devices both electrons and ions can be guided onto a sample to be examined. By way of example, it is known to additionally equip an SEM with an ion beam column. Using an ion beam generator arranged in the ion beam column, ions are generated which are used for the preparation of a sample (for example for removing a layer of the sample or for applying material to the sample) or else for imaging purposes. In this case, the SEM serves, in particular, for the observation of the preparation, but also for the further examination of the prepared or unprepared sample.

Furthermore, it is known from the prior art to arrange an aperture unit in an electron beam device. The known aperture unit has an aperture body having an aperture opening extending from a first side of the aperture body to a second side of the aperture body. The aperture opening is configured in such a way that electrons of the primary electron beam can pass through the aperture opening. The known aperture unit can have a plurality of functions. Firstly, it can have the function of aperture delimitation, such that only electrons from a specific beam cone of the primary electron beam pass through the aperture opening. The aperture unit accordingly has an aperture-delimiting effect. Secondly, it serves for example as a pressure stage, which, in the electron beam device, separates a first region having a first pressure (for example a high vacuum region) and a second region having a second pressure (for example an ultra high vacuum region) from one another. Furthermore, the known aperture unit can additionally be embodied as a detector or as part of a detector unit.

With regard to the prior art, reference is made for example to DE 198 28 476 A1 and EP 0 917 178 A1, which are incorporated herein by reference.

FIG. 1 shows an aperture unit 1 known from the prior art, said unit being provided with an aperture body 2 and an aperture opening 3. The aperture unit 1 is arranged in an evacuated beam column (not illustrated) of an electron beam device (not illustrated) and has a first side 4 of the aperture body 2, said first side being directed toward an electron beam generator (not illustrated), and a second side 5 of the aperture body 2, said second side being directed toward an object to be examined (not illustrated). The aperture opening 3 extends from the first side 4 to the second side 5 and is embodied in such a way that electrons of the primary electron beam generated by the electron beam generator can pass through the aperture opening 3 from the direction of the first side 4 in the direction of the second side 5 in order subsequently to be focused onto the object to be examined. The aperture opening 3 is embodied such that it is substantially cylindrical. The axis of symmetry of this cylindrical embodiment basically corresponds to the optical axis of the electron beam device. A central ray 6 of electrons of the primary electron beam runs substantially along the optical axis and passes unhindered through the aperture opening 3.

Electrons which are situated in an outer region of the beam cone of the primary electron beam, however, are masked out of the primary electron beam by the aperture body 2. By way of example, electrons of a first lateral ray 7 and of a second lateral ray 8 impinge on the first side 4 of the aperture body 2 and are masked out of the primary electron beam. When the electrons of the first lateral ray 7 and of the second lateral ray 8 impinge on the first side 4 of the aperture body 2, interaction particles arise, for example in the form of secondary electrons SE and backscattered electrons.

These interact with residual gas 9 (in particular hydrocarbons) which is still situated in the beam column and which has adsorbed, in particular, on a surface of the aperture body 2. Furthermore, the residual gas 9 can also move along the first side 4 of the aperture body 2. The interaction has the effect that said hydrocarbons are chemically altered and deposit on the first side 4 of the aperture body 2 as deposits 10 in the form of solid substances. As an alternative thereto, the electrons of the primary electron beam interact directly with the hydrocarbons, such that the latter are chemically altered and likewise deposit in the form of solid substances on the surface of the aperture body 2. After lengthy irradiation of the first side 4 by electrons of the primary electron beam and depending on the quantity of residual gas 9 present in the beam column, relatively large deposits 10 (contaminations) are formed. Furthermore, the interactions described likewise take place when electrons of the primary electron beam are incident on the deposits 10, such that the effect of deposit formation is further intensified. The geometry of the surface of the aperture body 2 is altered by the deposits 10. Even thin deposits 10 can lead to charges that influence the primary electron beam in an undesirable manner. This leads to undesired disturbances particularly in the case of imagings that are intended to be achieved. Furthermore, the deposits 10 can grow after a certain time of irradiation of the first side 4 of the aperture body 2 with the primary electron beam in such a way that the aperture opening 3 becomes overgrown. This is undesirable.

The effect of deposits also occurs on the second side 5 of the aperture body 2. Residual gas 11 (in particular hydrocarbons) is likewise situated on the second side 5 of the aperture body 2. On the second side 5 of the aperture body 2 in the region of the aperture opening 3 the residual gas 11 impinges on the primary electron beam, in particular on electrons of the primary electron beam which pass through the aperture opening 3 at the edge of the aperture opening 3. These are illustrated in FIG. 1 by a first marginal ray 12 and a second marginal ray 13. These electrons impinge, for example, on the edge region of the aperture opening 3, where they produce secondary electrons, in particular, as a result of interaction with the edge region of the aperture opening 3. Said secondary electrons in turn interact with the residual gas 11, thus resulting in deposits 14 at the aperture opening 3 in the region of the second side 5 of the aperture body 2. As an alternative thereto, the electrons of the primary electron beam interact directly with the residual gas 11, such that the deposits 14 occur. The deposits 14 occur at the edge region of the aperture opening 3 on the second side 5 of the aperture body 2. The above-described depositing process is continued further by constant subsequent diffusion of residual gas 11 at the deposits 14. The deposits 14 grow in the course of time as a result of continued irradiation with electrons of the primary electron beam in such a way that the aperture opening 3 becomes overgrown.

It has been found that the undesired effect of the deposits 14 is particularly great if the aperture unit 1 is used as a pressure stage and the pressure on the second side 5 of the aperture body 2 is higher than the pressure on the first side 4 of the aperture body 2.

Accordingly, it would be desirable to specify an aperture unit and a particle beam device comprising an aperture unit wherein the effect of the overgrowth of an aperture opening is prevented, reduced and/or at least slowed down.

SUMMARY OF THE INVENTION

According to the system described herein, an aperture unit is provided for a particle beam device, for example an electron beam device or an ion beam device. In particular, the aperture unit according to the system described herein is provided in the case of a scanning electron microscope. The aperture unit according to the system described herein has at least one aperture body having at least one first side and at least one second side. By way of example, the first side and the second side are formed by two opposite surfaces of the aperture body. In an alternative embodiment, the first side and the second side of the aperture body adjoin one another in such a way that they form an angle. Consequently, the system described herein can comprise any suitable relative arrangement of the first side and the second side with respect to one another. In addition to the aperture body, the aperture unit according to the system described herein has at least one aperture opening designed for the passage of particles. In this case, the particles pass from the first side of the aperture body in the direction of the second side of the aperture body through the aperture opening, which extends from the first side of the aperture body to the second side of the aperture body.

Furthermore, the aperture unit according to the system described herein has at least one first, three-dimensionally embodied deposit supporting unit for producing interaction particles and/or interaction radiation at the first side of the aperture body, wherein the first deposit supporting unit projects into the aperture body proceeding from the first side of the aperture body and/or wherein the first deposit supporting unit projects in a direction opposite to the first side of the aperture body proceeding from the first side of the aperture body. Furthermore, it is provided that the first deposit supporting unit is arranged at a distance from a first edge of the aperture opening.

In addition or as an alternative thereto, in the case of the aperture unit according to the system described herein it is provided that at least one second, three-dimensionally embodied deposit supporting unit for producing interaction particles and/or interaction radiation is arranged at the second side of the aperture body, wherein the second deposit supporting unit projects into the aperture body proceeding from the second side of the aperture body and/or wherein the second deposit supporting unit projects in a direction opposite to the second side of the aperture body proceeding from the second side of the aperture body. Furthermore, it is provided that the second deposit supporting unit is arranged at a distance from a second edge of the aperture opening.

It is provided, for example, that the first deposit supporting unit is at a distance from the first edge of the aperture opening such that the first deposit supporting unit does not adjoin the first edge of the aperture opening. Furthermore, for example, the second deposit supporting unit is at a distance from the second edge of the aperture opening such that the second deposit supporting unit does not adjoin the second edge of the aperture opening.

The system described herein is based on the consideration that it is possible to avoid deposits in the region of the aperture opening of the aperture unit if residual gas (in particular hydrocarbons) can no longer reach the region of the aperture opening. This is possible, for example, when the residual gas is deposited in a specific region at the aperture unit which is not situated in the vicinity of the aperture opening. This specific region is accordingly a "barrier" for the residual gas. This concept is implemented in the case of the system described herein such that the first deposit supporting unit and/or the second deposit supporting unit are/is arranged at the aperture unit. If a particle beam, for example a primary electron beam, impinges on the first deposit supporting unit, secondary electrons or backscattered electrons arise to an increased extent in comparison with other regions on the aperture unit, said electrons interacting with the residual gas in such a way that deposits of the residual gas form in the region of the first deposit supporting unit. The same similarly applies to the second deposit supporting unit. Secondary electrons or scattered electrons generally impinge thereon. This has the consequence that secondary electrons in turn arise in particular to an increased extent in the region of the second deposit supporting unit, said electrons interacting with the residual gas in such a way that deposits of the residual gas form in the region of the second deposit supporting unit. Since the residual gas is therefore "fixed" and cannot diffuse via the first deposit supporting unit and/or the second deposit supporting unit, it can no longer reach the aperture opening. Although it is not completely ruled out that residual gas will still reach the aperture opening and deposit there, this effect is significantly reduced and slowed down on account of the system described herein.

In one embodiment of the aperture unit according to the system described herein, it is additionally or alternatively provided that the first side of the aperture body has a first roughness profile with a first roughness, which is determined by a first arithmetic mean roughness value ($R_a$) and/or by a first maximum height ($R_z$) of the first roughness profile. A first maximum distance between the first deposit supporting unit and the first side of the aperture body is at least ten times greater than the first arithmetic mean roughness value ($R_a$). In addition or as an alternative thereto, the first maximum distance between the first deposit supporting unit and the first side of the aperture body is at least three times greater than the first maximum height ($R_z$) of the first roughness profile. In a further embodiment, it is additionally or alternatively provided that the second side of the aperture body has a second roughness profile with a second roughness, which is determined by a second arithmetic mean roughness value ($R_a$) and/or by a second maximum height ($R_z$) of the second roughness profile. A second maximum distance between the second deposit supporting unit and the second side of the aperture body is at least ten times greater than the second arithmetic mean roughness value ($R_a$). In addition or as an alternative thereto, the second maximum distance between the second deposit supporting unit and the second side of the aperture body is at least three times greater than the second maximum height ($R_z$) of the second roughness profile.

In a further embodiment of the aperture unit according to the system described herein, it is additionally or alternatively provided that the aperture unit has at least one of the following features:

the first arithmetic mean roughness value ($R_a$) is less than 0.05 μm;

the second arithmetic mean roughness value ($R_a$) is less than 0.05 μm;

the first maximum height ($R_z$) of the first roughness profile is less than 0.2 μm; or the second maximum height ($R_z$) of the second roughness profile is less than 0.2 μm.

Accordingly, the first maximum distance between the first deposit supporting unit and the first side (for example the maximum height of an elevation or the maximum depth of a depression from the first side) can be, for example, greater than 0.5 μm. In one embodiment, the first maximum distance is in a range of 0.5 μm to 3 μm, wherein here the range limits are concomitantly encompassed by the claimed range. The same can similarly hold true for the second maximum distance between the second deposit supporting unit and the second side (for example the maximum height of an elevation or the maximum depth of a depression from the second side). By way of example, the second maximum distance is in a range of 0.5 μm to 3 μm, wherein here the range limits are concomitantly encompassed by the claimed range.

In one embodiment, the aperture unit according to the system described herein has at least one of the following features:

the first deposit supporting unit is at a distance from the first edge of the aperture opening in the range of 2 μm to 50 μm;

the first deposit supporting unit is at a distance from the first edge of the aperture, opening in the range of 2 μm to 30 μm;

the first deposit supporting unit is at a distance from the first edge of the aperture opening in the range of 5 μm to 20 μm;

the second deposit supporting unit is at a distance from the second edge of the aperture opening in the range of 2 μm to 50 μm;

the second deposit supporting unit is at a distance from the second edge of the aperture opening in the range of 2 μm to 30 μm; or the second deposit supporting unit is at a distance from the second edge of the aperture opening in the range of 5 μm to 20 μm.

It is explicitly pointed out that the system described herein is not restricted to the distances mentioned above. Rather, any suitable distance can be chosen for the system described herein.

The geometrical form of the first deposit supporting unit and/or of the second deposit supporting unit can assume any suitable configuration. It is not restricted to specific configurations. In one embodiment of the system described herein, however, it is alternatively or additionally provided that the first deposit supporting unit is arranged as a first cutout at the first side of the aperture body. In addition or as an alternative thereto it is provided that the second deposit supporting unit is arranged as a second cutout at the second side of the aperture body.

In a further embodiment of the system described herein, it is alternatively or additionally provided that the first deposit supporting unit is arranged as a first projection at the first side of the aperture body. Once again as an alternative or in addition thereto, it is provided that the second deposit supporting unit is arranged as a second projection at the second side of the aperture body. In this case, the configuration of the first projection and/or of the second projection can be chosen as desired. All that is essential is that the first projection is configured in such a way that it is directed in a direction that is opposite to the first side of the aperture body, and stands out from the first side of the aperture body. The same correspondingly applies to the second projection. The latter should be configured such that it is directed in a direction which is opposite to the second side of the aperture body, and stands out from the second side of the aperture body. By way of example, provision is made for embodying the first projection and/or the second projection as a rectangular bar extending at least along part of the first side and/or of the second side of the aperture body. In particular, it is provided that the rectangular bar extends from a first lateral boundary to a second lateral boundary of the first side and/or of the second side of the aperture body.

As mentioned above, the configuration of the first deposit supporting unit and/or of the second deposit supporting unit can be chosen as desired. By way of example, provision is made for embodying the first deposit supporting unit and/or the second deposit supporting unit in the form of a groove or in the form of a hole closed on one side. In a further exemplary embodiment, it is alternatively or additionally provided that the first deposit supporting unit is embodied in rectangular fashion or in substantially rectangular fashion. In addition or as an alternative thereto, provision is made for embodying the second deposit supporting unit in rectangular fashion or in substantially rectangular fashion.

In a further embodiment of the system described herein, it is additionally or alternatively provided that the first deposit supporting unit has at least one first base area at which is arranged at least one first side area which extends in the direction of a first point arranged above the first base area. Alternatively or additionally it is provided that the second deposit supporting unit has at least one second base area at which is arranged at least one second side area which extends in the direction of a second point arranged above the second base area. By way of example, the first deposit supporting unit and/or the second deposit supporting unit in each case have/has a triangular cross-sectional area or a substantially triangular cross-sectional area. In this case, above and also below, a cross section is understood to mean, for example, the cross section along a longitudinal axis running through the aperture opening from the first side to the second side of the aperture body. As an alternative or in addition thereto, it is provided that the first deposit supporting unit and/or the second deposit supporting unit are/is embodied in conical fashion. By way of example, the first deposit supporting unit and/or the second deposit supporting unit are/is respectively embodied as cones arranged at the surface of the aperture body. As an alternative or in addition thereto, it is provided that the first deposit supporting unit and/or the second deposit supporting unit are/is respectively formed as a conical cutout arranged at the surface of the aperture body.

In a further embodiment of the aperture unit according to the system described herein, it is alternatively or additionally provided that the aperture unit has one of the following features:

the aperture opening is embodied in cylindrical fashion in a cross section;

the aperture opening is embodied in conical fashion in a cross section;

the aperture opening is embodied in conical fashion in a cross section, wherein the conical embodiment has a first extent at the first side of the aperture body and a second extent at the second side of the aperture body, wherein the first extent is embodied such that it is smaller than the second extent; or the aperture opening is embodied in conical fashion in a cross section, wherein the conical embodiment has a first extent at the first side of the aperture body and a second extent at the second side of the aperture body, wherein the first extent is embodied such that it is larger than the second extent.

It is explicitly pointed out that the system described herein is not restricted to the abovementioned embodiments of the aperture opening. Rather, any embodiment which is suitable for the system described herein may be used. By way of example, an aperture opening that is gap-shaped, quadrangular, triangular or elliptic in cross section may also be used.

In a further embodiment of the aperture unit according to the system described herein, it is additionally or alternatively provided that the aperture body is embodied in partly transmissive fashion in a region at the aperture opening. In other words, the aperture body is configured in such a way that particles of a particle beam (for example electrons of an electron beam) are transmitted through the aperture body. The transmitted particles serve for obtaining an interaction with residual gas on the second side of the aperture body, such that the residual gas deposits at the second deposit supporting unit.

In an in turn further exemplary embodiment of the aperture unit according to the system described herein, it is alternatively or additionally provided that at least one third projection is arranged at the second side of the aperture body and delimits the aperture opening at the second side. The third projection is configured in such a way that particles of a particle beam (for example electrons of an electron beam) can be transmitted through the third projection and/or produce secondary particles, for example secondary electrons, in the third projection. The transmitted particles and/or the secondary particles likewise serve for obtaining an interaction with residual gas on the second side of the aperture body, such that the residual gas deposits at the second deposit supporting unit.

In one embodiment of the aperture unit according to the system described herein, it is additionally or alternatively provided that a first transition from the aperture body to the aperture opening is arranged at the first side of the aperture body, wherein the first transition is embodied such that it is at least partly roundish. In addition or as an alternative thereto, it is provided that a second transition from the aperture body to the aperture opening is arranged at the second side of the aperture body, wherein the second transition is embodied such that it is at least partly roundish. In this case, above and also below, a roundish embodiment is understood to mean an embodiment in which relatively sharp edges are reduced or avoided. This is because it has been found that relatively sharp edges at the boundary of the aperture opening promote a depositing of residual gases at the boundary of the aperture opening and hence overgrowth of the aperture opening. One embodiment provides, for example, for freeing the first transition and/or the second transition of relatively sharp edges to the greatest possible extent by removal of material, using an ion beam, for example. As an alternative or in addition thereto, provision is made for providing the first transition and/or the second transition with a coating which is configured in roundish fashion and covers relatively sharp edges. The layer thickness of the coating can be chosen in a suitable manner. By way of example, the layer thickness is in the range of approximately 150 nm to 300 nm, in particular in the range of 170 nm to 250 nm. In one exemplary embodiment, a layer thickness of approximately 200 nm can be used. By way of example, gold, silver, titanium and/or any other suitable conductive material or any other suitable material compound is suitable as material for the coating.

In an in turn further exemplary embodiment of the aperture unit according to the system described herein, it is additionally or alternatively provided that the aperture body and/or the aperture opening are/is provided with a coating. In this case, provision is made, in particular, for arranging a coating at the aperture body and/or the aperture opening, said coating being composed of a material which firstly reduces depositing of residual gas and which secondly inhibits the production of secondary particles, in particular secondary electrons. This has the effect that, in comparison with the prior art, smaller and/or more slowly growing deposits of residual gas occur at the aperture body and/or the aperture opening. By choosing a suitable layer thickness of the coating, provision is also made, for example, for reducing the transmission of particles through the aperture body, which likewise leads to smaller and/or more slowly growing deposits of residual gas at the aperture body and/or the aperture opening in comparison with the prior art. By way of example a thickness of approximately 5 nm to approximately 300 nm or a thickness of 50 nm to 200 nm can be chosen as the layer thickness. However, it is expressly pointed out that the system described herein is not restricted to the layer thicknesses mentioned above. Rather, any suitable layer thickness can be chosen. By way of example, gold, silver, titanium and/or any other suitable conductive material or any other suitable material compound or material alloys are suitable as coating materials.

Considerations have revealed that the coating, for example, may comprise a material or consists of a material which has a resistivity of less than or equal to $5 \times 10^6$ $\Omega$cm. This avoids or reduces charging of the aperture unit, such that a particle beam is not influenced at the aperture unit. Alternatively or additionally, provision is made for this purpose for the coating to comprise a material having a maximum secondary emission coefficient which is in the range of 0.9 to 1.9 (the range limits are concomitantly included in the stated range). In this case, the secondary emission coefficient is the ratio of the number of secondary particles (for example secondary electrons) produced to the number of particles of a primary particle beam (for example a primary electron beam) that are incident on an object. The secondary emission coefficient is dependent on the energy of the primary particle beam. The material in this embodiment enables low production of interaction particles which could lead to interactions with residual gas. In an in turn further embodiment, it is additionally or alternatively provided that the coating covers a surface, that the coating has a first roughness characteristic variable, that the surface has a second roughness characteristic variable, and that the first roughness characteristic variable is less than the second roughness characteristic variable. By way of example, the first roughness characteristic variable is an arithmetic mean roughness value and, by way of example, the second roughness characteristic variable is an arithmetic mean roughness value. The second roughness characteristic variable (for example 0.05 µm) is, in particular, twice as large as the first roughness characteristic variable (for example 0.025 µm).

Accordingly, the coating is embodied such that it is smoother than the surface. This also prevents the production of interaction particles, since the latter arise in particular at edges and corners upon the incidence of particles.

As already mentioned above, the first deposit supporting unit can have any three-dimensional configuration within the system described herein. By way of example, the first deposit supporting unit can be embodied as a first depression and/or a first elevation at the first side of the aperture body. The first depression and/or the first elevation can have any three-dimensional configuration. By way of example, the first depression is embodied as a type of recess or a hole. In a further embodiment, it is provided that the first depression and/or the first elevation are/is embodied for example in conical fashion in cross section. The second deposit supporting unit, too, can have any three-dimensional configuration according to the system described herein (see above). By way of example, the second deposit supporting unit can be embodied as a second depression and/or a second elevation at the second side of the aperture body. The second depression and/or the second elevation can have any three-dimensional configuration. By way of example, the second depression is embodied as a type of recess or a hole. In a further embodiment, it is provided that the second depression and/or the second elevation are/is embodied for example in conical fashion in cross section.

By way of example, the maximum height of an elevation or the maximum depth of a depression with respect to the roughness is in a range of 0.5 μm to 3 μm (see above), wherein the range limits here are concomitantly encompassed by the claimed range.

In a further embodiment of the aperture unit according to the system described herein, the aperture unit alternatively or additionally has a plurality of first deposit supporting units at the first side of the aperture body. Consequently, the system described herein is not restricted to only an individual first deposit supporting unit being arranged at the first side; rather, it is also possible for a plurality of first deposit supporting units to be arranged at the first side. The same also holds true, for example, for the second deposit supporting unit. For here as well it is alternatively or additionally provided that the aperture unit has a plurality of second deposit supporting units at the second side of the aperture body.

In a further embodiment of the aperture unit according to the system described herein, it is additionally or alternatively provided that at least two of the plurality of first deposit supporting units have a different three-dimensional configuration with respect to one another. By way of example, it is provided that one of the plurality of first deposit supporting units is embodied as a depression and the other of the plurality of first deposit supporting units is embodied as an elevation. However, the system described herein is not restricted to these embodiments. Rather, any different types of three-dimensional configurations of the plurality of first deposit supporting units can be combined with one another. The same also holds true for the plurality of second deposit supporting units. Here, in a further embodiment of the aperture unit according to the system described herein, it is additionally or alternatively provided that at least two of the plurality of second deposit supporting units have a different three-dimensional configuration with respect to one another. By way of example, it is provided that one of the plurality of second deposit supporting units is embodied as a depression and the other of the plurality of second deposit supporting units is embodied as an elevation. However, the system described herein is not restricted to these embodiments. Rather, any different types of three-dimensional configurations of the plurality of second deposit supporting units can be combined with one another.

In a further embodiment of the system described herein, it is additionally or alternatively provided that the plurality of first deposit supporting units are arranged in a predeterminable geometry at the first side of the aperture body. By way of example, the plurality of first deposit supporting units are arranged in circular fashion or in spiral fashion around the aperture opening. As an alternative or in addition thereto, provision is made for arranging the plurality of first deposit supporting units in a cascaded fashion. This is understood to mean that at least two of the plurality of first deposit supporting units have a different height. In particular, it is provided that the height of the first deposit supporting units increases with greater distance from the aperture opening.

In an in turn further embodiment of the system described herein, it is additionally or alternatively provided that the plurality of second deposit supporting units are arranged in a predeterminable geometry at the second side of the aperture body. By way of example, the plurality of second deposit supporting units are arranged in circular fashion or in spiral fashion around the aperture opening. As an alternative or in addition thereto, provision is made for arranging the plurality of second deposit supporting units in a cascaded fashion. This is understood to mean that at least two of the plurality of second deposit supporting units have a different height. In particular, it is provided that the height of the second deposit supporting units increases with greater distance from the aperture opening.

The system described herein also relates to a further aperture unit for a particle beam device, in particular for an electron beam device. This further aperture unit can have at least one of the abovementioned features or a combination of at least two of the abovementioned features. This further aperture unit is provided with at least one aperture body having at least one first side and at least one second side. Furthermore, the further aperture unit has at least one aperture opening which is designed for the passage of particles from the first side of the aperture body to the second side of the aperture body and extends from the first side of the aperture body to the second side of the aperture body. Furthermore, the further aperture unit is provided with at least one coating for reducing the formation of interaction particles and/or interaction radiation, wherein the coating is arranged at the aperture body and/or the aperture opening. Since the coating reduces the ability of the aperture body and/or the aperture opening to produce in particular interaction particles (for example secondary electrons and/or transmitted electrons), fewer interactions with residual gas present in a particle beam device occur in comparison with the prior art. This brings about a reduction of deposits at the aperture body and a slower build-up of deposits at the aperture body and/or the aperture opening than in the case of the prior art.

In one embodiment of the further aperture unit, it is additionally or alternatively provided that the coating comprises a material having a maximum secondary emission coefficient or consists of a material having a maximum secondary emission coefficient which is in the range of 0.9 to 1.9 (the range limits are included in this range). Considerations have revealed that materials having a secondary emission coefficient specified above are well suited to the further aperture unit.

In a further embodiment of the further aperture unit, it is additionally or alternatively provided that the coating covers a surface, that the coating has a first roughness characteristic variable, that the surface has a second roughness characteristic variable, and that the first roughness characteristic variable is less than the second roughness characteristic variable. In other words, the coating is embodied such that it is smoother than that surface of the aperture body which is covered by the coating. Consequently, the coating has fewer edges than the covered surface at which, in particular, interaction particles can arise upon the incidence of particles. In particular, provision is made for choosing a material for the coating which forms only a small number of nuclides that will increase the roughness of the coating. By way of example, the first roughness characteristic variable is an arithmetic mean roughness value and, by way of example, the second roughness characteristic variable is an arithmetic mean roughness value. The second roughness characteristic variable (for example 0.05 µm) is, in particular, twice as large as the first roughness characteristic variable (for example 0.025 µm).

In a further embodiment of this further aperture unit, it is additionally or alternatively provided that the coating comprises a material having a resistivity or consists of a material having a resistivity which is less than or equal to $5 \times 10^6$ Ωcm. Considerations have revealed that such a material prevents the aperture unit from being charged. Influences on a particle beam that passes through the aperture unit are avoided or reduced in this way.

In yet another embodiment of the further aperture unit, it is additionally or alternatively provided that the coating is formed by at least one of the following materials: gold, silver, titanium, platinum, iridium, copper, carbon and a polymer. However, the system described herein is not restricted to the materials mentioned above. Moreover, any material can be used which is suitable for the stated purpose.

It is once again explicitly pointed out that in each of the above-described embodiments of the aperture units, the interaction particles can be provided by secondary particles, in particular secondary electrons.

The system described herein also relates to a particle beam device, in particular an electron beam device or an ion beam device. The particle beam device according to the system described herein is provided with at least one first particle beam column, wherein the first particle beam column has at least one first particle beam generator for generating a first particle beam. Furthermore, the particle beam device according to the system described herein is provided with at least one first objective lens for focusing the first particle beam onto an object, wherein interaction particles and/or interaction radiation in turn arise(s) when the first particle beam impinges on the object. Furthermore, at least one first aperture unit having at least one of the abovementioned features or a combination of at least two of the abovementioned features is arranged at the first particle beam device. The first aperture unit is arranged in a region between the first particle beam generator and the first objective lens. However, it is explicitly pointed out that the system described herein is not restricted to an arrangement of this type. Rather, the first aperture unit—as seen from the first particle beam generator in the direction of the first objective lens—can be arranged downstream of the first objective lens. Furthermore, the particle beam device has at least one detector for detecting the interaction particles and/or the interaction radiation. The detector provides a signal that is used for imaging purposes, for example.

In a further exemplary embodiment of the particle beam device according to the system described herein, the particle beam device is additionally or alternatively provided with at least one second particle beam column, wherein the second particle beam column has at least one second particle beam generator for generating a second particle beam. In addition thereto, the particle beam device can also have at least one second objective lens for focusing the second particle beam onto the object. In one embodiment of the particle beam device according to the system described herein, the first particle beam column is embodied as an electron beam column and the second particle beam column is embodied as an ion beam column. As an alternative thereto, provision may be made for embodying the first particle beam column as an ion beam column and the second particle beam column as an electron beam column. Once again as an alternative thereto, provision is made for embodying both the first particle beam column and the second particle beam column in each case as an electron beam column or in each case as an ion beam column.

BRIEF DESCRIPTION OF THE DRAWINGS

The system described herein is explained in greater detail below on the basis of exemplary embodiments. In this case, in the figures.

DETAILED DESCRIPTION OF VARIOUS EMBODIMENTS

The system described herein is explained in greater detail using a particle beam device in the form of an SEM. However, it is expressly pointed out that the system described herein is not restricted to an SEM. Rather, the system described herein can be realized in any particle beam device, in particular an ion beam device.

Figure 1:
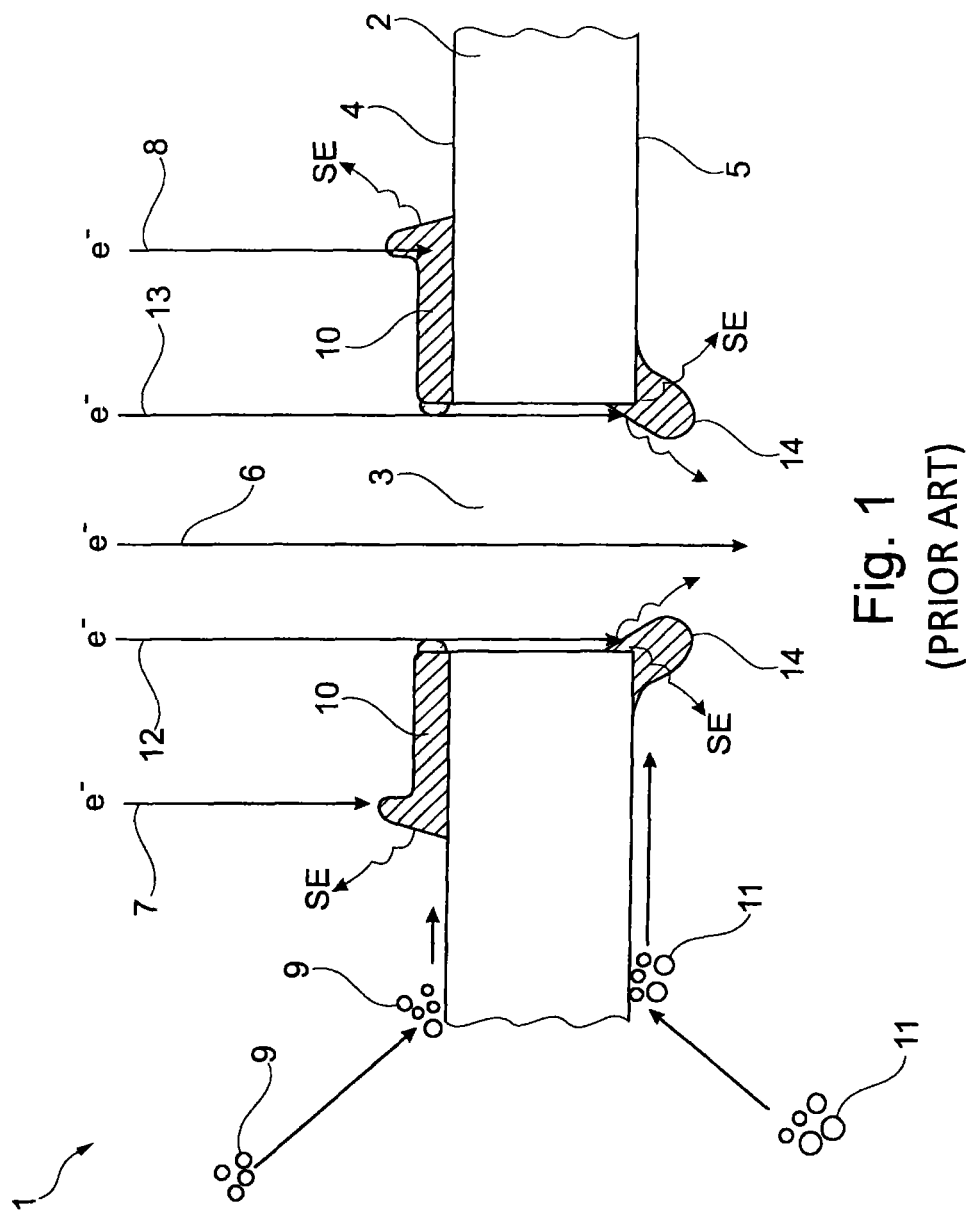
FIG. 1 shows a schematic illustration of an aperture unit for a particle beam device according to the prior art.
Figure 2:
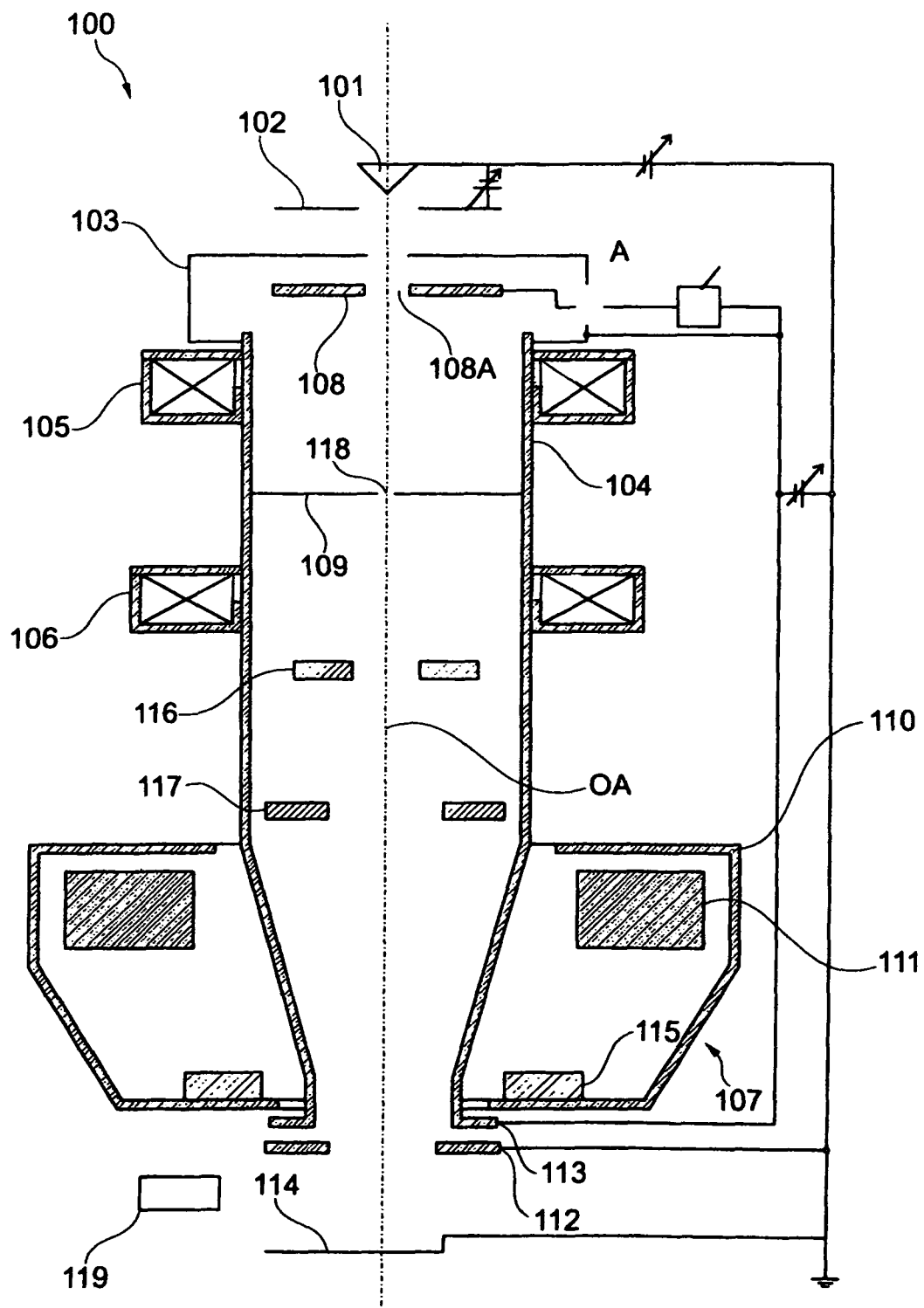
FIG. 2 shows a schematic illustration of an electron beam device with aperture units according to an embodiment of the system described herein.

FIG. 2 shows a schematic illustration of an SEM 100. The SEM 100 has a beam generator in the form of an electron source 101 (cathode), an extraction electrode 102 and an anode 103, which is placed onto one end of a beam guiding tube 104 of the SEM 100. By way of example, the electron source 101 is embodied as a thermal field emitter. However, the system described herein is not restricted to an electron source of this type. Rather, any electron source can be used.

Electrons which emerge from the electron source 101 form a primary electron beam. The electrons are accelerated to anode potential on account of a potential difference between the electron source 101 and the anode 103. In the exemplary embodiment illustrated here, the anode potential is 1 kV to 20 kV relative to a ground potential of a housing of a sample chamber (not illustrated), for example 5 kV to 15 kV, in particular 8 kV. However, it could alternatively also be at ground potential.

Two condenser lenses are arranged at the beam guiding tube 104, namely a first condenser lens 105 and a second condenser lens 106. In this case, firstly the first condenser lens 105 and then the second condenser lens 106 are arranged proceeding from the electron source 101 in the direction of an objective lens 107.

A first aperture unit 108 is arranged between the anode 103 and the first condenser lens 105. The first aperture unit 108 together with the anode 103 and the beam guiding tube 104 is at high voltage potential, namely the potential of the anode 103, or at ground. The first aperture unit 108 has numerous first aperture openings 108A, one of which is illustrated in FIG. 2. Each of the numerous first aperture openings 108A has a different opening diameter. Using an adjusting mechanism (not illustrated), it is possible to set a desired first aperture opening 108A to the optical axis OA of the SEM 100. A stationary second aperture unit 109 is arranged between the first condenser lens 105 and the second condenser lens 106. The first aperture unit 108 and the second aperture unit 109 will be discussed in even greater detail further below.

The objective lens 107 has pole shoes 110, in which a hole is formed. The beam guiding tube 104 is led through said hole. Furthermore, a coil 111 is arranged in the pole shoes 110. An electrostatic delay device is connected downstream of the beam guiding tube 104. Said delay device has an individual electrode 112 and a tube electrode 113, which is formed at that end of the beam guiding tube 104 which faces a sample 114. Consequently, the tube electrode 113 together with the beam guiding tube 104 is at the potential of the anode 103, while the individual electrode 112 and the sample 114 are at a potential that is lower than the potential of the anode 103. In the present case, this is the ground potential of the housing of the sample chamber (not illustrated). In this way, the electrons of the primary electron beam can be decelerated to a desired energy required for the examination of the sample 114.

The SEM 100 furthermore has a raster device 115, by which the primary electron beam can be deflected and scanned in a raster pattern over the sample 114. In this case, the electrons of the primary electron beam interact with the sample 114. Interaction particles and/or interaction radiation arise(s) as a consequence of the interaction and are/is detected. The detection signals obtained in this way are evaluated.

As interaction particles, in particular, electrons are emitted from the surface of the sample 114 (so-called secondary electrons) or electrons of the primary electron beam are backscattered (so-called backscattered electrons). In order to detect secondary electrons and/or the backscattered electrons, a detector arrangement is arranged in the beam guiding tube 104, said detector arrangement having a first detector 116 and a second detector 117. In this case, the first detector 116 is arranged along the optical axis OA on the source side, while the second detector 117 is arranged along the optical axis OA on the sample side in the beam guiding tube 104. Furthermore, the first detector 116 and the second detector 117 are arranged in a manner offset with respect to one another in the direction of the optical axis OA of the SEM 100. Both the first detector 116 and the second detector 117 each have a passage opening, through which the primary electron beam can pass, and are approximately at the potential of the anode 103 and of the beam guiding tube 104. The optical axis OA of the SEM 100 passes through the respective passage openings.

The second detector 117 serves for detecting those electrons which emerge from the sample 114 at a relatively large solid angle. They are primarily secondary electrons. By contrast, only a very small proportion of electrons backscattered at the sample 114 (backscattered electrons), which, in comparison with the secondary electrons, have a relatively high kinetic energy upon emerging from the sample 114, are detected by the second detector 117, since the backscattered electrons are focused relatively close to the optical axis OA by the objective lens 107 and can therefore pass through the passage opening of the second detector 117. The first detector 116 therefore serves for detecting the backscattered electrons. The detection signals generated by the first detector 116 and the second detector 117 are used to generate an image or images of the surface of the sample 114.

It is explicitly pointed out that the aperture openings of the first aperture unit 108 and of the second aperture unit 109 and also the passage openings of the first detector 116 and of the second detector 117 are illustrated in an exaggerated fashion. The passage openings of the first detector 116 and of the second detector 117 have a longest extent in the range of 1 mm to 5 mm. By way of example, they are embodied in circular fashion and have a diameter in the range of 1 mm to 3 mm. The size of the aperture openings of the first aperture unit 108 and of the second aperture unit 109 will be discussed in even greater detail hereinafter and further below.

In the exemplary embodiment illustrated here, the second aperture unit 109 is configured as a pinhole aperture and is provided with a second aperture opening 118 for the passage of the primary electron beam, which has an extent in the range of 5 μm to 500 μm, for example 35 μm. The second aperture unit 109 is embodied as a pressure stage aperture. It separates a first region, in which the electron source 101 is arranged and in which an ultra high vacuum prevails ($10^{-6}$ to $10^{-10}$ Pa), from a second region, which has a high vacuum ($10^{-1}$ to $10^{-5}$ Pa). The second region is the intermediate pressure region of the beam guiding tube 104, which leads to the sample chamber (not illustrated).

Alongside image generation, in the case of the SEM 100 there are further examination methods which can be used for examining the sample 114. These include the so-called EBSD method ("Electron Backscattered Diffraction"), wherein the diffraction patterns of the scattered electrons are determined. A further examination method is based on the detection of cathodoluminescence light, which emerges from the sample 114 when the primary electron beam is incident on the sample 114. Further examination methods are, for example, examination by energy-dispersive X-ray spectroscopy (EDX) and examination by wavelength-dispersive X-ray spectroscopy (WDX). For these further examination methods, at least one third detector 119 is provided, which is arranged in the region between the beam guiding tube 104 and the sample 114. Further third detectors 119 can also be provided (not illustrated).

Figure 3:
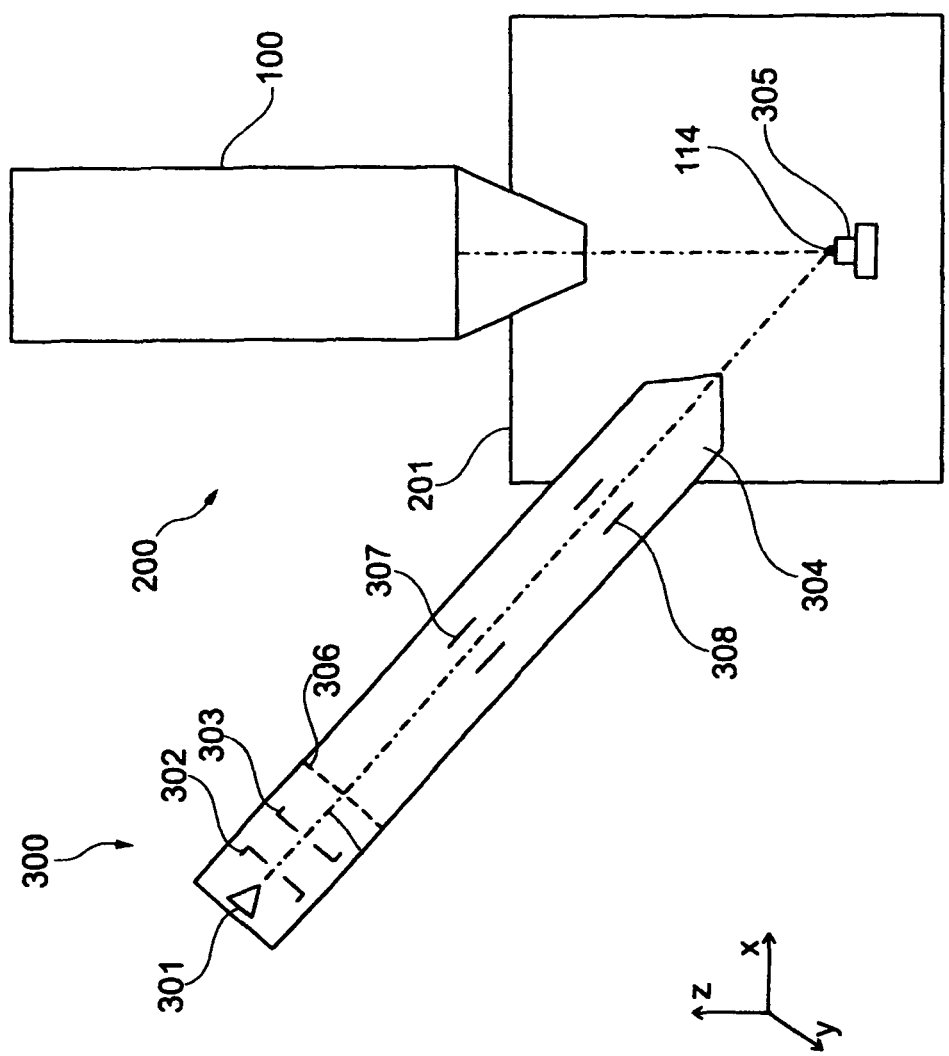
FIG. 3 shows a schematic illustration of a particle beam device having both an electron beam column and an ion beam column according to an embodiment of the system described herein.

FIG. 3 shows a particle beam device in the form of a combination device 200. The combination device 200 has two particle beam columns. Firstly, the combination device is provided with the SEM 100 as already illustrated in FIG. 2. The SEM 100 is arranged at a sample chamber 201 and serves for generating a first particle beam, namely the primary electron beam already described further above. Secondly, the combination device 200 is provided with an ion beam device 300, which is likewise arranged at the sample chamber 201. The SEM 100 is arranged vertically with respect to the sample chamber 201.

The ion beam device 300 is arranged in the manner inclined by an angle of approximately 50° with respect to the SEM 100. It has an ion beam generator 301, by which ions are generated which form a second particle beam in the form of an ion beam. The ions are accelerated to a predeterminable potential using an extraction electrode 302. The second particle beam then passes through an ion optical unit of the ion beam device 300, wherein the ion optical unit has a condenser lens 303 and an arrangement of further lenses 304, which form a second objective lens. The lenses 304 finally produce an ion probe that is focused onto the sample 114 arranged on a sample holder 305.

Arranged above the lenses 304 (that is to say in the direction of the ion beam generator 301) are an adjustable aperture 306, a first electrode arrangement 307 and a second electrode arrangement 308, wherein the first electrode arrangement 307 and the second electrode arrangement 308 are embodied as raster electrodes.

Using the first electrode arrangement 307 and the second electrode arrangement 308, the second particle beam is scanned in a raster pattern over the surface of the sample 114, wherein the first electrode arrangement 307 acts in a first direction and the second electrode arrangement 308 acts in a second direction, which is opposite to the first direction. Therefore, the scanning is effected for example in the x-direction. The scanning in a y-direction perpendicular thereto is effected by further electrodes (not illustrated) rotated by 90° on the first electrode arrangement 307 and on the second electrode arrangement 308.

The distances illustrated in FIG. 3 between the individual elements of the combination device 200 are illustrated in an exaggerated manner, in order to better illustrate the individual elements of the combination device 200.

Figure 4:
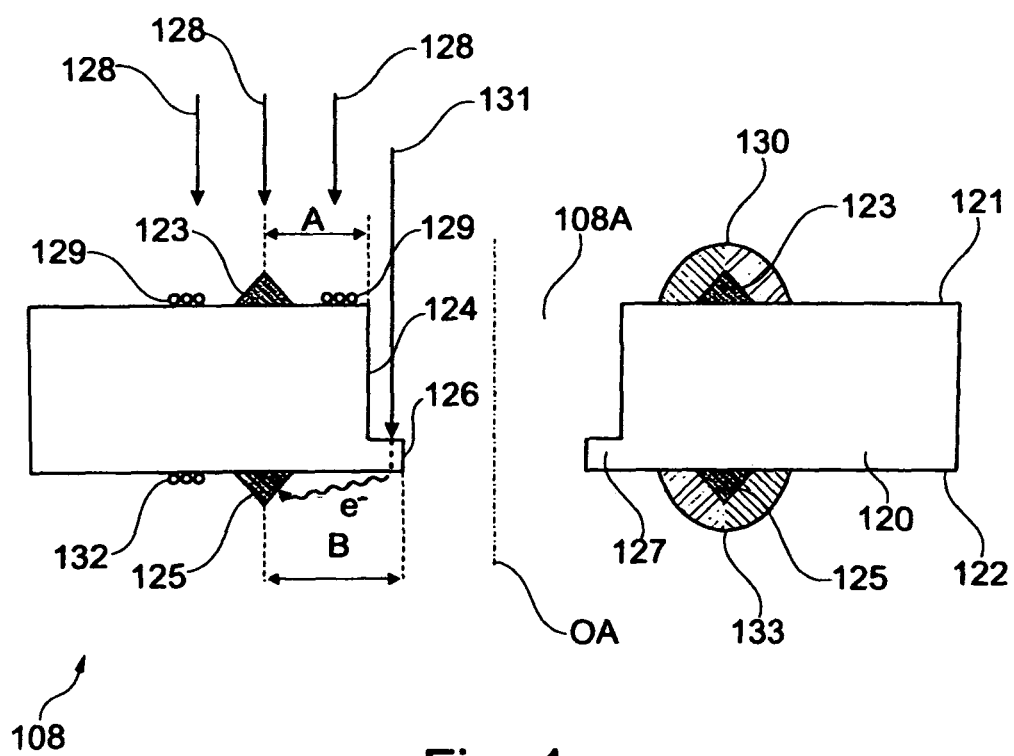
FIG. 4 shows a schematic illustration of an embodiment of an aperture unit according to the system described herein.

FIG. 4 shows the first aperture unit 108 in a schematic illustration. The second aperture unit 109 can be constructed identically to the first aperture unit 108, such that the following statements also apply to the second aperture unit 109.

The first aperture unit 108 has an aperture body 120 provided with a first side 121 and a second side 122. In the exemplary embodiment illustrated here, the first side 121 and the second side 122 are formed by two opposite areas of the aperture body 120. The distance (and hence the thickness of the aperture body 120) between the first side 121 and the second side 122 is, for example, in the range of approximately 1 μm to approximately 100 μm. Furthermore—as already mentioned above—at least one first aperture opening 108A is provided. The first aperture opening 108A is designed for the passage of electrons of the primary electron beam from the first side 121 of the aperture body 120 to the second side 122 of the aperture body 120. It extends from the first side 121 of the aperture body 120 to the second side 122 of the aperture body 120. The first aperture opening 108A has, for example, a diameter in the range of 5 μm to 500 μm. By way of example, the diameter is approximately 20 μm.

Furthermore, the first aperture unit 108 has a first deposit supporting unit 123 at the first side 121 of the aperture body 120. The first deposit supporting unit 123 is substantially triangular in cross section and is embodied as a projection. In the case of the embodiment illustrated here, the first deposit supporting unit 123 is arranged over an angular range of 360° around the first aperture opening 108A on the first side 121 of the aperture body 120. In an alternative embodiment (not illustrated), the first deposit supporting unit 123 is formed from numerous projections and/or depressions which are arranged for example on a ring-shaped region over an angular range of 360° around the first aperture opening 108A on the first side 121 of the aperture body 120 and/or which are embodied in conical fashion, for example.

As can be seen from FIG. 4, the first deposit supporting unit 123 is arranged in a manner spaced apart at a distance A from a first edge 124 of the first aperture opening 108A. This will be discussed in even greater detail further below.

Furthermore, the first aperture unit 108 has a second deposit supporting unit 125 at the second side 122 of the aperture body 120. The second deposit supporting unit 125 is likewise substantially triangular in cross section and is embodied as a projection. In the case of the embodiment illustrated here, the second deposit supporting unit 125 is also arranged over an angular range of 360° around the first aperture opening 108A on the second side 122 of the aperture body 120. In an alternative embodiment (not illustrated), the second deposit supporting unit 125 is formed from numerous projections and/or depressions which are arranged for example on a ring-shaped region over an angular range of 360° around the first aperture opening 108A on the second side 122 of the aperture body 120 and/or which are embodied in conical fashion, for example.

The second deposit supporting unit 125 is arranged in a manner spaced apart at a distance B from a second edge 126 of the first aperture opening 108A. This, too, will be discussed in even greater detail further below.

In the exemplary embodiment illustrated here, the aperture body 120 is formed from gold or platinum. Furthermore, the first deposit supporting unit 123 and the second deposit supporting unit 125 are likewise formed from gold or platinum.

As can be seen from FIG. 4, the first deposit supporting unit 123 is at a distance from the first edge 124 of the first aperture opening 108A in such a way that the first deposit supporting unit 123 does not adjoin the first edge 124 of the first aperture opening 108A. Furthermore, the second deposit supporting unit 125 is at a distance from the second edge 126 of the first aperture opening 108A in such a way that the second deposit supporting unit 125 does not adjoin the second edge 126. The distance A and/or the distance B can be, for example, in a range of 2 μm to 50 μm, in particular in a range of 2 μm to 30 μm, or of 5 μm to 20 μm.

A further projection 127 is arranged on the second side 122 of the aperture body 120, said further projection delimiting the extent of the first aperture opening 108A in the region of the second side 122 of the aperture body 120. The further projection 127 is embodied in transmissive fashion. This means that electrons of the primary electron beam can be transmitted through the further projection 127. Furthermore, in particular secondary electrons and scattered electrons are produced thereby.

The effect of the first aperture unit 108 will be discussed below. Lateral rays 128 of electrons of the primary electron beam impinge on the first side 121 of the aperture body 120. In this case, said lateral rays 128 also impinge on the first deposit supporting unit 123. In particular on account of the angular embodiment of the first deposit supporting unit 123, secondary electrons arise to an increased extent at the first deposit supporting unit 123. Said secondary electrons interact with residual gas 129 (for example the hydrocarbons already discussed further above) situated at the first side 121 of the aperture body 120. On account of the interaction, a deposit is formed in the region of the first deposit supporting unit 123. This is only illustrated on the right-hand half of FIG. 4, for the sake of better clarity. A first deposit 130 forms around the first deposit supporting unit 123.

As mentioned above, the aperture body 120 has a projection 127 on the second side 122 in the region of the first aperture opening 108A, said projection being embodied in transmissive fashion. Marginal rays 131 of electrons of the primary electron beam, which pass through the first aperture opening 108A at the edge of the first aperture opening 108A, are transmitted through the projection 127 and are scattered in the process. Furthermore, they can also produce secondary electrons on account of an interaction with the material of the projection 127. In this case, a portion of these scattered electrons and secondary electrons pass in the direction of the second deposit supporting unit 125 and impinge on the material of the second deposit supporting unit 125. In this case, secondary electrons once again arise, which interact with residual gas 132 (for example hydrocarbons) in such a way that deposits occur in the region of the second deposit supporting unit 125. This, too, is only illustrated on the right-hand half of FIG. 4, for the sake of better clarity. A second deposit 133 forms around the second deposit supporting unit 125.

Both the first deposit supporting unit 123 and the second deposit supporting unit 125 basically form a type of trap or a type of barrier for contaminations (namely for the first deposit 130 and the second deposit 133). What is made possible as a result is that said contaminations can no longer reach the region of the first aperture opening 108A as easily. The residual gas 129 and 132 is firstly deposited in specific regions, namely at the first deposit supporting unit 123 and at the second deposit supporting unit 125, wherein these specific regions are situated at a certain distance from the first aperture opening 108A. Although it is not ruled out that, after a certain time of irradiation of the first aperture unit 108 with the primary electron beam, the first deposit 130 and the second deposit 133 grow in such a way that they reach the first aperture opening 108A. Consequently, it is also not ruled out that the first aperture opening 108A can be overgrown again after a certain time. However, the system described herein reduces and slows down the effect that the residual gas 129 and 132 can pass as far as the first aperture opening 108A and deposit there as contamination. Considerations have revealed that the first aperture unit 108 has, for example, a service life up to four times longer than that of an aperture unit from the prior art.

The first side 121 of the aperture body 120 has a first roughness profile having a first roughness, which is determined by a first arithmetic mean reference value ($R_a$) and/or by a first maximum height ($R_z$) of the first roughness profile. A first maximum distance between the first deposit supporting unit 123 and the first side 121 of the aperture body 120 is at least ten times greater than the first arithmetic mean roughness value ($R_a$). In addition or as an alternative thereto, the first maximum distance between the first deposit supporting unit 123 and the first side 121 of the aperture body 120 is at least three times greater than the first maximum height ($R_z$) of the first roughness profile. Furthermore, the second side 122 of the aperture body 120 has a second roughness profile having a second roughness, which is determined by a second arithmetic mean roughness value ($R_a$) and/or by a second maximum height ($R_z$) of the second roughness profile. A second maximum distance between the second deposit supporting unit 125 and the second side 122 of the aperture body 120 is at least ten times greater than the second arithmetic mean roughness value ($R_a$). In addition or as an alternative thereto, the second maximum distance between the second deposit supporting unit 125 and the second side 122 is at least three times greater than the second maximum height ($R_z$) of the second roughness profile.

By way of example, the first arithmetic mean roughness value ($R_a$), the second arithmetic mean roughness value ($R_a$), the first maximum height ($R_z$) of the first roughness profile and the second maximum height ($R_z$) of the second roughness profile have the values already mentioned above. Accordingly, the first maximum distance between the first deposit supporting unit 123 and the first side 121 can be greater than at least 0.5 µm, for example. By way of example, it is in the range of 0.5 µm to 3 µm. The second maximum distance between the second deposit supporting unit 125 and the second side 122 is likewise greater than at least 0.5 µm, for example. By way of example, the second maximum distance is in a range of 0.5 µm to 3 µm.

Figure 5:
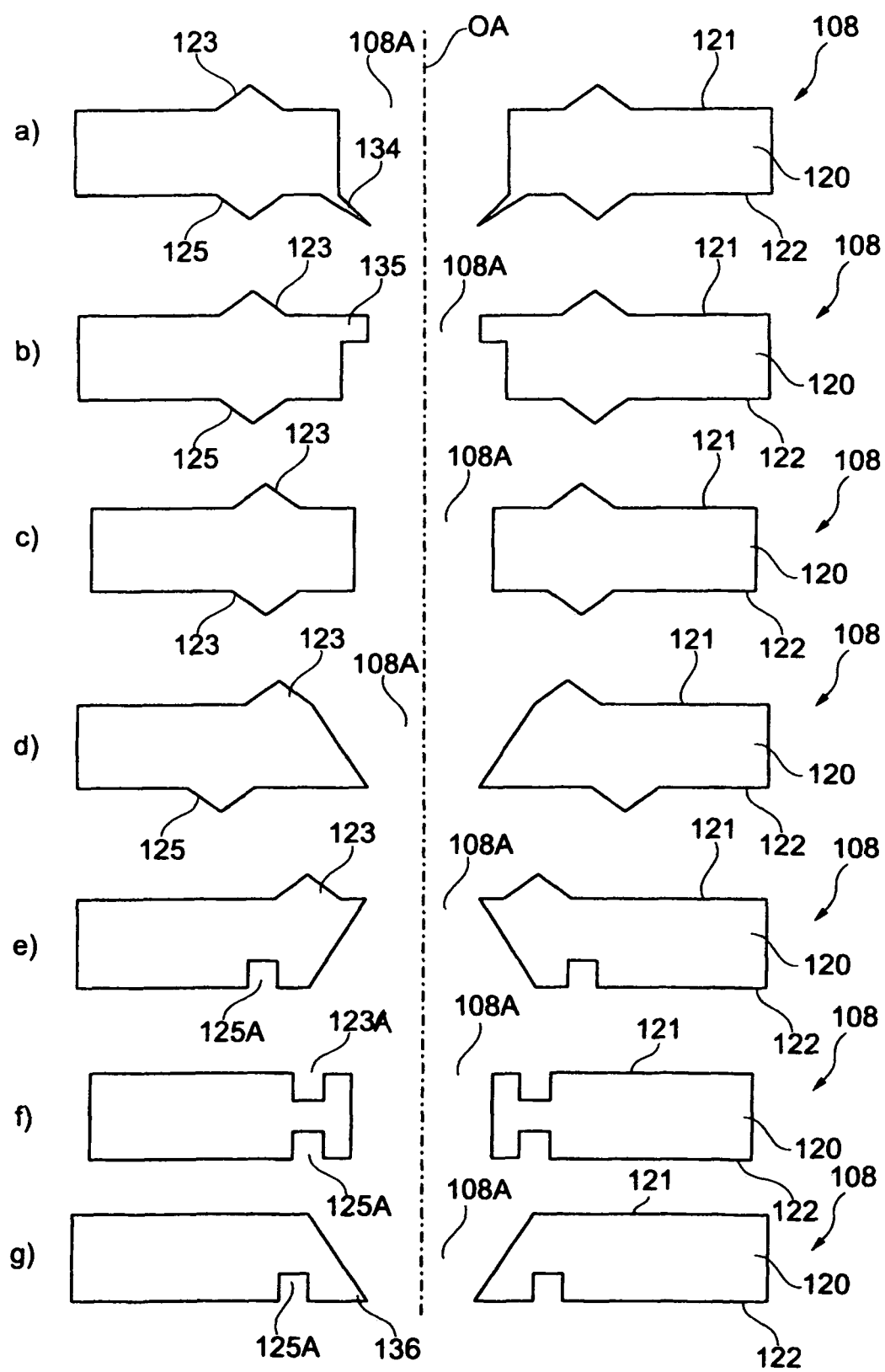
FIG. 5 shows schematic illustrations of further embodiments of the aperture unit according to the system described herein.

FIG. 5 shows schematic illustrations of further embodiments of the first aperture unit 108. The second aperture unit 109 can also be configured in this way. The embodiments illustrated in FIGS. 5a to 5g each have deposit supporting units which extend, for example, in ring-shaped fashion around the first aperture opening 108A. The embodiments in FIG. 5 are based on the exemplary embodiment in FIG. 4. Therefore, identical components are provided with identical reference symbols.

FIG. 5a shows a further embodiment of the aperture unit 108. The latter has the aperture body 120 having the first side 121 and the second side 122. The first deposit supporting unit 123 is arranged at the first side 121 of the aperture body 120. The second deposit supporting unit 125 is arranged at the second side 122 of the aperture body 120. In the case of this exemplary embodiment, both the first deposit supporting unit 123 and the second deposit supporting unit 125 are integrally connected to the aperture body 120 and are produced from the same material (for example from gold or platinum) as the aperture body 120. They were produced for example by a removal process using an ion beam. In addition, a triangular projection 134 is arranged in the region of the first aperture opening 108A at the second side 122 of the aperture body 120, which projects from the aperture body 120 into the first aperture opening 108A. The triangular projection 134 has the same function as the projection 127 of the exemplary embodiment in FIG. 4.

FIG. 5b shows a further exemplary embodiment of the first aperture unit 108. This exemplary embodiment is based on the exemplary embodiment of the first aperture unit 108 in accordance with FIG. 5a and differs from it in that, at the first side 121 of the aperture body 120, a projection 135 that is substantially rectangular in its cross section is formed in the region of the first aperture opening 108A. The rectangular projection 135 is integrally connected to the aperture body 120 and is therefore formed from the same material (for example gold or platinum) as the aperture body 120. The rectangular projection 135 has the same function as the projection 127 of the exemplary embodiment in accordance with FIG. 4.

The exemplary embodiment in FIG. 5c is based on the exemplary embodiment of the first aperture unit 108 in accordance with FIG. 5a. Therefore, identical components are designated by identical reference symbols. The exemplary embodiment in accordance with FIG. 5c differs from the exemplary embodiment in accordance with FIG. 5a only in that no projection is arranged in the region of the first aperture opening 108A.

The exemplary embodiment in FIG. 5d is based on the exemplary embodiment of the first aperture unit 108 in accordance with FIG. 5a. Identical components are once again designated by identical reference symbols. The exemplary embodiment in accordance with FIG. 5d differs from the exemplary embodiment in accordance with FIG. 5a in that the first aperture opening 108A is embodied in conical fashion. The first aperture opening 108A has a first diameter in the region of the first side 121 of the aperture body 120 and a second diameter in the region of the second side 122 of the aperture body 120, wherein the first diameter is embodied such that it is greater than the second diameter. Furthermore, the first deposit supporting unit 123 is directly adjacent to the edge of the first aperture opening 108A in the region of the first side 121 of the aperture body 120.

The exemplary embodiment in FIG. 5e is also based on the exemplary embodiment of the first aperture unit 108 in accordance with FIG. 5a. Identical components are once again designated by identical reference symbols. In contrast to the exemplary embodiment in accordance with FIG. 5a, the first aperture opening 108A is embodied in conical fashion. The first aperture opening 108A has a first diameter in the region of the first side 121 of the aperture body 120 and a second diameter in the region of the second side 122 of the aperture body 120, wherein the second diameter is embodied such that it is greater than the first diameter. Furthermore, the second deposit supporting unit 125A is embodied as a cutout arranged in the form of a groove at the second side 122 of the aperture body 120. On account of the symmetrical embodiment, the second deposit supporting unit 125A is embodied in ring-shaped fashion. The groove per se has a substantially rectangular configuration in cross section.

The exemplary embodiment in accordance with FIG. 5f is based on the exemplary embodiment in FIG. 5c. Identical components are provided with identical reference symbols. In contrast to the exemplary embodiment in FIG. 5c, a first deposit supporting unit 123A is arranged at the first side 121 of the aperture body 120. A second deposit supporting unit 125A is arranged at the second side 122 of the aperture body 120. Both the first deposit supporting unit 123A and the second deposit supporting unit 125A are embodied as a cutout in the form of a groove. The groove per se has a substantially rectangular configuration in cross section and can be implemented with a depth such that a portion of the electrons can be transmitted in the region of the groove.

The exemplary embodiment in FIG. 5g is placed on the exemplary embodiment in FIG. 5a. Therefore, identical components are provided with the same reference symbols. In contrast to the exemplary embodiment in FIG. 5a, the exemplary embodiment in FIG. 5g has no projection per se in the region of the first aperture opening 108A. However, the first aperture opening 108A is embodied in conical fashion. The first aperture opening 108A has a first diameter on the first side 121 of the aperture body 120 and a second diameter on the second side 122 of the aperture body 120, wherein the second diameter is less than the first diameter. This gives rise to a section 136 having the function of the triangular projection 134 of the exemplary embodiment in FIG. 5a. Moreover, a deposit supporting unit is arranged explicitly at the second side 122, namely the second deposit supporting unit 125A. The second deposit supporting unit 125A is embodied as a cutout in the form of a groove. The groove per se has a substantially rectangular configuration in cross section.

Figure 6:
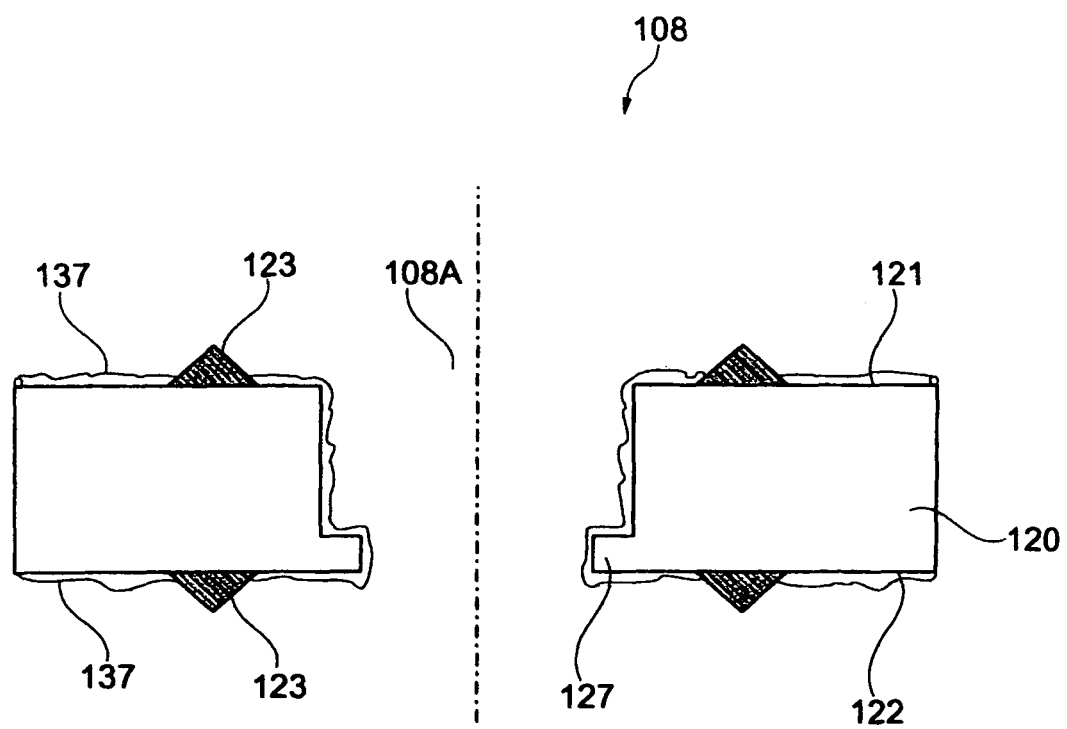
FIG. 6 shows a schematic illustration of an in turn further embodiment of the aperture unit according to the system described herein.

FIG. 6 shows a further exemplary embodiment of the first aperture unit 108. The exemplary embodiment in FIG. 6 is based on the exemplary embodiment in FIG. 4. Therefore, identical components are provided with identical reference symbols. The exemplary embodiment in FIG. 6 differs from the exemplary embodiment in FIG. 4 in that a coating 137 is applied both on the first side 121 and on the second side 122 of the aperture body 120. The coating 137 is also applied to the aperture body 120 in the region of the first aperture opening 108A. In the exemplary embodiment illustrated here, silver or titanium, for example, is provided as material for the coating 137. Said coating 137 can have the following functions. Firstly, edges at the first aperture unit 108 are rounded in this way, such that a smaller number of secondary electrons arise when the primary electron beam is incident on these edges. The smaller number of secondary electrons reduces the interaction with residual gas and therefore also a depositing of contaminations in the region of the edges. Secondly, the coating 137 can be formed from a material that in principle inhibits the depositing of contaminations on account of its chemical properties. Furthermore, it is possible to choose the layer thickness of the coating 137 in such a way as to reduce a transmission of electrons of the primary electron beam apart from the region of the projection 127. This reduces the probability of residual gases depositing in the form of contaminations (except in the region of the second deposit supporting unit 125).

Figure 7:
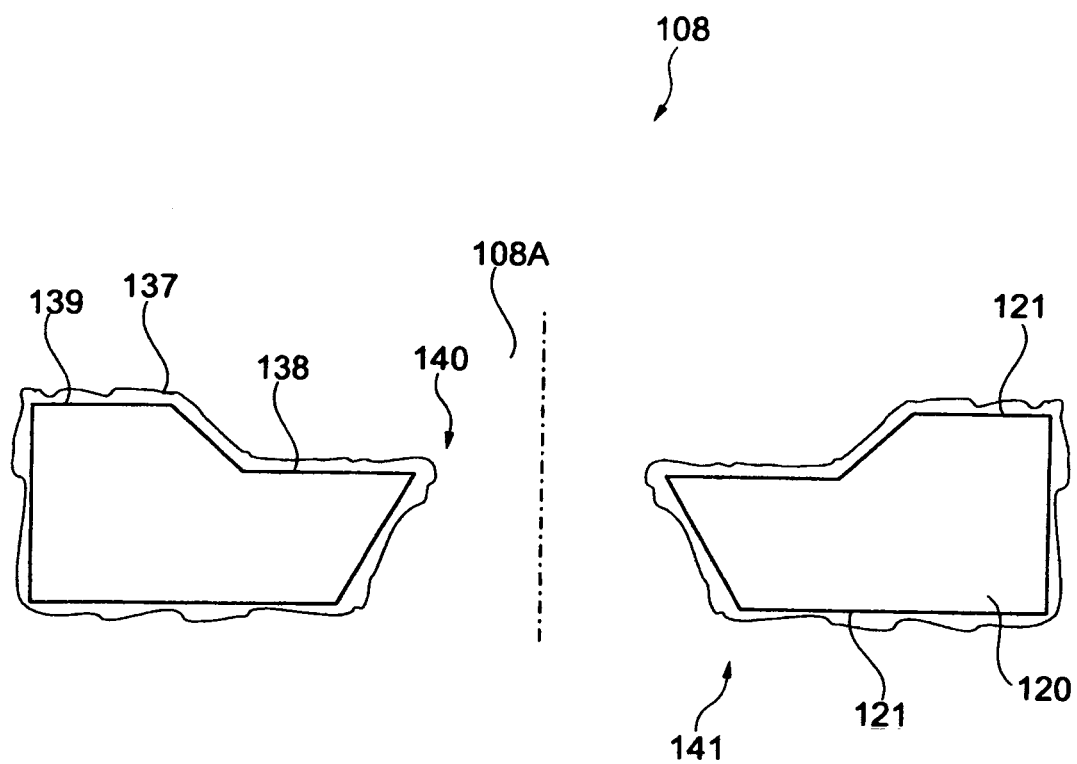
FIG. 7 shows a schematic illustration of yet another embodiment of the aperture unit according to the system described herein.

FIG. 7 shows a further exemplary embodiment of the first aperture unit 108. The exemplary embodiment in FIG. 7 is based on the exemplary embodiment in FIG. 4. Therefore, identical components are provided with identical reference symbols. In contrast to the exemplary embodiment in FIG. 4, the first aperture opening 108A of the exemplary embodiment in FIG. 7 is embodied in conical fashion. The first aperture opening 108A has a first diameter at the first side 121 of the aperture body 120 and a second diameter at the second side 122 of the aperture body 120, wherein the first diameter is less than the second diameter. Furthermore, the first aperture unit 108 is embodied in a stepped fashion. In the region of a first step 138, the extent of the aperture body 120 from the first side 121 to the second side 122 has approximately 1 µm to approximately 20 µm. In the region of a second step 139, the extent of the aperture body 120 from the first side 121 to the second side 122 has approximately 10 µm to approximately 100 µm.

Furthermore, the aperture body 120 including the region around the first aperture opening 108A is provided with a coating 137, for example composed of gold, silver, titanium, platinum, iridium, copper, carbon and/or a polymer. Firstly, edges at the first aperture unit 108 are rounded with the coating 137 (it is also possible for there to be a plurality of layers of a coating), such that a smaller number of secondary electrons arise when the primary electron beam is incident on these edges. The smaller number of secondary electrons reduces the interaction with residual gas and hence also a depositing of contaminations in the region of the edges. In particular, a depositing of contaminations in a first region 140 at the first side 121 of the aperture body 120 is reduced and slowed down. Secondly, the coating 137 can be formed from a material which in principle inhibits the depositing of contaminations on account of its chemical properties. Furthermore, it is possible to choose the layer thickness of the coating 137 in such a way as to reduce a transmission of electrons of the primary electron beam from the first side 121 to the second side 122 of the aperture body 120. This reduces the probability of residual gases depositing in the form of contaminations at the aperture body 120. In particular, a depositing of contaminations in a second region 141 at the second side 122 of the aperture body 120 is reduced and slowed down.

The coating 137 comprises a material having a maximum secondary emission coefficient which is in the range of 0.9 to 1.9 (the range limits are included in this range). Furthermore, the coating 137, which covers the surface of the aperture body 120, is chosen in such a way that the coating 137 has a first roughness characteristic variable, that the surface has a second roughness characteristic variable, and that the first roughness characteristic variable is less than the second roughness characteristic variable. In other words, the coating 137 is embodied such that it is smoother than that surface of the aperture body 120 which is covered by the coating 137. Moreover, the coating 137 comprises a material having a resistivity that is less than or equal to $5 \times 10^6$ Ωcm.

Figure 8:
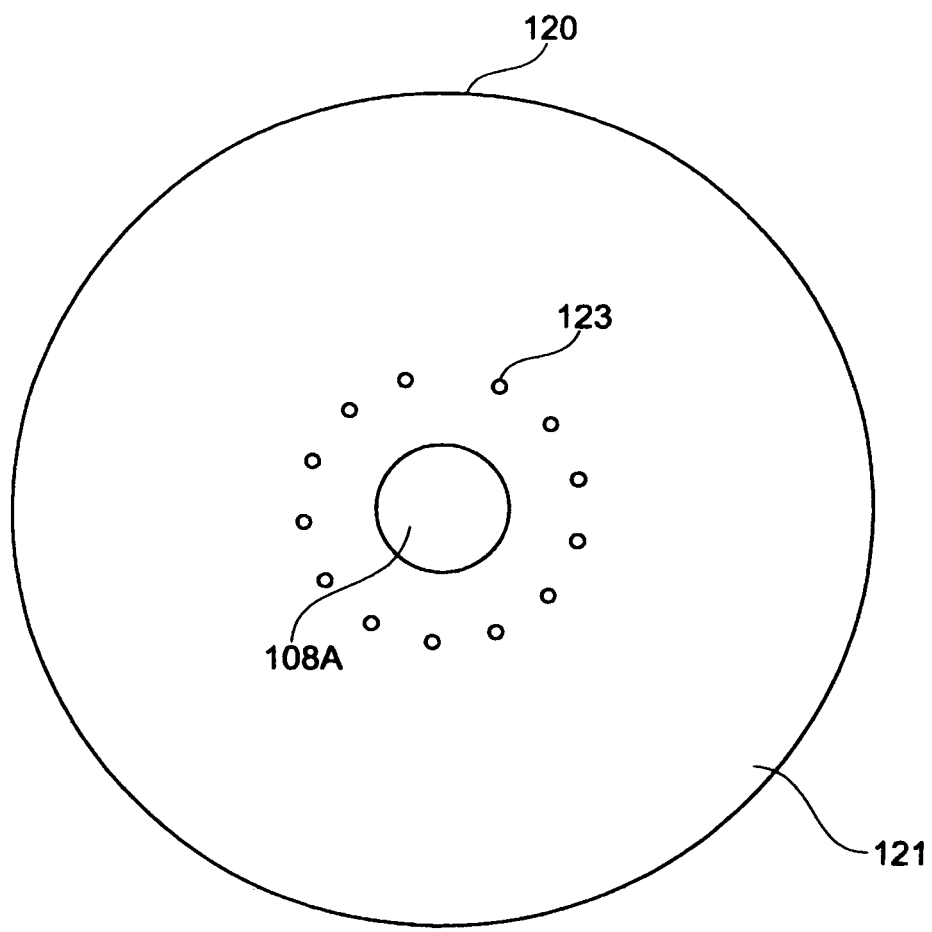
FIG. 8 shows a schematic illustration of an arrangement of a plurality of first deposit supporting units at an aperture unit according to an embodiment of the system described herein.

FIG. 8 shows a schematic plan view of the first side 121 of the aperture body 120 of the first aperture unit 108. A plurality of first deposit supporting units 123 are arranged at the first side 121 of the aperture body 120. The plurality of first deposit supporting units 123 are arranged in a ring-shaped fashion around the first aperture opening 108A. However, the system described herein is not restricted to an arrangement of this type. Rather, the plurality of first deposit supporting units 123 can be arranged in any geometrical form or alternatively arbitrarily at the first side 121 of the aperture body 120. The plurality of first deposit supporting units 123 can be arranged, for example, as elevation or depression at the first side 121 of the aperture body 120. One embodiment provides for different three-dimensional configurations of first deposit supporting units 123 to be combined with one another. By way of example, one of the plurality of first deposit supporting units 123 is embodied as a depression, while another of the plurality of first deposit supporting units 123 is embodied as an elevation.

The statements above correspondingly hold true for a plurality of second deposit supporting units 125 at the second side 122 of the aperture body 120.

Figure 9:
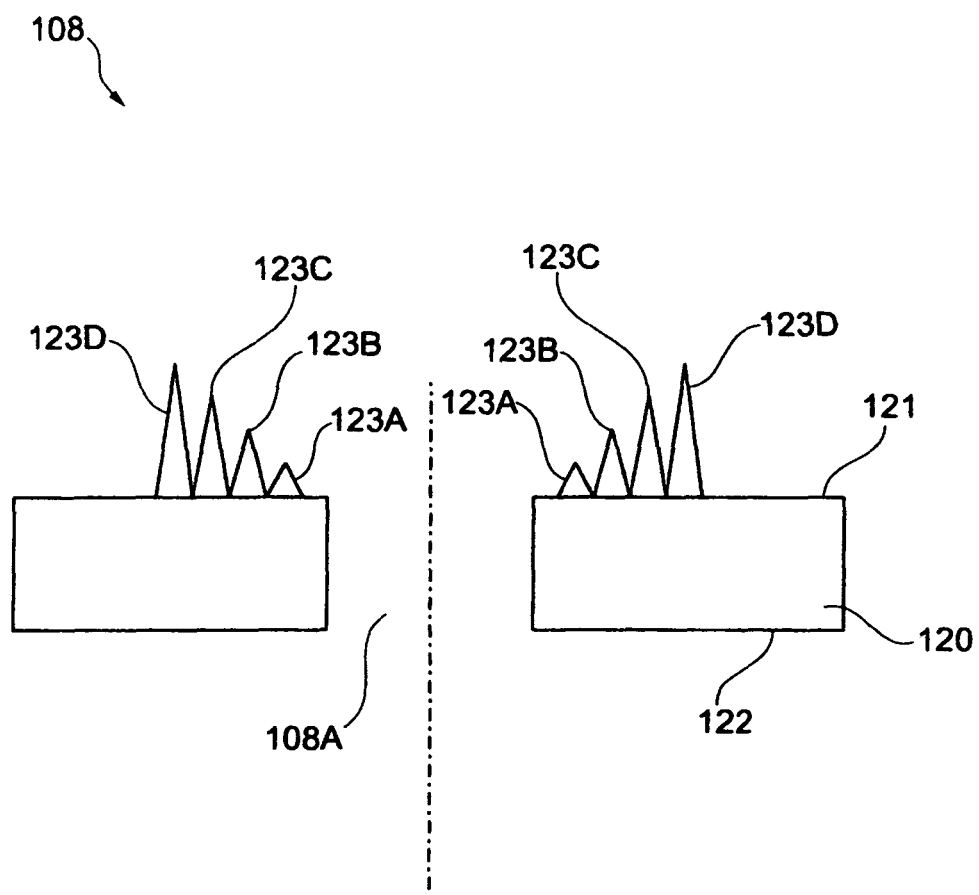
FIG. 9 shows a schematic illustration of a further arrangement of a plurality of first deposit supporting units at an aperture unit according to an embodiment of the system described herein.

FIG. 9 shows a further exemplary embodiment of the aperture unit 108. A plurality of first deposit supporting units 123A to 123D in the form of elevations are arranged at the first side 121. These are arranged in a cascaded manner respectively at a different predetermined distance around the first aperture opening 108A. The height of the elevations increases with increasing distance of each of the plurality of first deposit supporting units 123A to 123D from the first aperture opening 108A.

The statements above correspondingly hold true for a plurality of second deposit supporting units 125 at the second side 122 of the aperture body 120.

Various embodiments discussed herein may be combined with each other in appropriate combinations in connection with the system described herein. Additionally, in some instances, the order of steps in the flowcharts, flow diagrams and/or described flow processing may be modified, where appropriate. Further, various aspects of the system described herein may be implemented using software, hardware, a combination of software and hardware and/or other computer-implemented modules or devices having the described features and performing the described functions. Software implementations of the system described herein may include executable code that is stored in a computer readable medium and executed by one or more processors. The computer readable medium may include a computer hard drive, ROM, RAM, flash memory, portable computer storage media such as a CD-ROM, a DVD-ROM, a flash drive and/or other drive with, for example, a universal serial bus (USB) interface, and/or any other appropriate tangible or non-transitory computer readable medium or computer memory on which executable code may be stored and executed by a processor. The system described herein may be used in connection with any appropriate operating system.

Other embodiments of the invention will be apparent to those skilled in the art from a consideration of the specification or practice of the invention disclosed herein. It is intended that the specification and examples be considered as exemplary only, with the true scope and spirit of the invention being indicated by the following claims.

What is claimed is:

1. An aperture unit for a particle beam device, comprising:
    at least one aperture body having at least one first side and at least one second side;
    at least one aperture opening allowing passage of particles from the first side of the aperture body to the second side of the aperture body, wherein the at least one aperture opening extends from the first side of the aperture body to the second side of the aperture body; and
    at least one deposit supporting unit that is a unit for depositing residual gas in a region of the at least one deposit supporting unit, wherein at least one of the following features is further provided:
    (i) the at least one deposit supporting unit includes at least one first, three-dimensionally embodied deposit supporting unit for producing interaction particles or interaction radiation arranged at the first side of the aperture body, wherein the first deposit supporting unit projects according to at least one of: (a) into the aperture body proceeding from the first side of the aperture body or (b) in a direction opposite to the first side of the aperture body proceeding from the first side of the aperture body, and wherein the first deposit supporting unit is arranged at a distance from a first edge of the aperture opening; or
    (ii) the at least one deposit supporting unit includes at least one second, three-dimensionally embodied deposit supporting unit for producing interaction particles or interaction radiation arranged at the second side of the aperture body, wherein the second deposit supporting unit projects according to at least one of: (a) into the aperture body proceeding from the second side of the aperture body or (b) in a direction opposite to the second side of the aperture body proceeding from the second side of the aperture body, and wherein the second deposit supporting unit is arranged at a distance from a second edge of the aperture opening.

2. The aperture unit according to claim 1, wherein the aperture unit further comprises at least one of the following features:
    (i) the first side of the aperture body has a first roughness profile with a first roughness, which is determined by at least one of: a first arithmetic mean roughness value or a first maximum height of the first roughness profile, wherein a first maximum distance between the first deposit supporting unit and the first side of the aperture body is at least one of: (a) at least ten times greater than the first arithmetic mean roughness value, or (b) at least three times greater than the first maximum height of the first roughness profile; or
    (ii) the second side of the aperture body has a second roughness profile with a second roughness, which is determined by at least one of: a second arithmetic mean roughness value or a second maximum height of the second roughness profile, wherein a second maximum distance between the second deposit supporting unit and the second side of the aperture body is at least one of: (a) at least ten times greater than the second arithmetic mean roughness value, or (b) at least three times greater than the second maximum height of the second roughness profile.

3. The aperture unit according to claim 2, further comprising at least one of the following features:
    (i) the first arithmetic mean roughness value is less than 0.05 μm;
    (ii) the second arithmetic mean roughness value is less than 0.05 μm;
    (iii) the first maximum height of the first roughness profile is less than 0.2 μm; or
    (v) the second maximum height of the second roughness profile is less than 0.2 μm.

4. The aperture unit according to claim 1, further comprising one of the following features:
    (i) the first deposit supporting unit is at a distance from the first edge of the aperture opening in the range of 2 μm to 50 μm;

(ii) the first deposit supporting unit is at a distance from the first edge of the aperture opening in the range of 2 µm to 30 µm;

(iii) the first deposit supporting unit is at a distance from the first edge of the aperture opening in the range of 5 µm to 20 µm;

(iv) the second deposit supporting unit is at a distance from the second edge of the aperture opening in the range of 2 µm to 50 µm;

(v) the second deposit supporting unit is at a distance from the second edge of the aperture opening in the range of 2 µm to 30 µm; or (vi) the second deposit supporting unit is at a distance from the second edge of the aperture opening in the range of 5 µm to 20 µm.

5. The aperture unit according to claim 1, further comprising at least one of the following features:

(i) the first deposit supporting unit is arranged as a first cutout at the first side of the aperture body; or (ii) the second deposit supporting unit is arranged as a second cutout at the second side of the aperture body.

6. The aperture unit according to claim 1, further comprising at least one of the following features:

(i) the first deposit supporting unit is arranged as a first projection at the first side of the aperture body; or (ii) the second deposit supporting unit is arranged as a second projection at the second side of the aperture body.

7. The aperture unit according to claim 1, further comprising at least one of the following features:

(i) the first deposit supporting unit is embodied in rectangular fashion; or (ii) the second deposit supporting unit is embodied in rectangular fashion.

8. The aperture unit according to claim 1, further comprising at least one of the following features:

(i) the first deposit supporting unit has at least one first base area at which is arranged at least one first side area which extends in the direction of a first point arranged above the first base area; or (ii) the second deposit supporting unit has at least one second base area at which is arranged at least one second side area which extends in the direction of a second point arranged above the second base area.

9. The aperture unit according to claim 8, further comprising at least one of the following features:

(i) the first deposit supporting unit is embodied such that it is at least partly conical; or (ii) the second deposit supporting unit is embodied such that it is at least partly conical.

10. The aperture unit according to claim 1, further comprising one of the following features:

(i) the aperture opening is embodied in cylindrical fashion in cross section;

(ii) the aperture opening is embodied in conical fashion in cross section;

(iii) the aperture opening is embodied in conical fashion in cross section, wherein the conical embodiment has a first extent at the first side of the aperture body and a second extent at the second side of the aperture body, wherein the first extent is embodied such that it is smaller than the second extent; or (iv) the aperture opening is embodied in conical fashion in cross section, wherein the conical embodiment has a first extent at the first side of the aperture body and a second extent at the second side of the aperture body, wherein the first extent is embodied such that it is larger than the second extent.

11. The aperture unit according to claim 1, wherein the aperture body is embodied in transmissive fashion in a region at the aperture opening.

12. The aperture unit according to claim 1, wherein at least one third projection is arranged at the second side of the aperture body and delimits the aperture opening at the second side of the aperture body.

13. The aperture unit according to claim 1, further comprising at least one of the following:

(i) a first transition from the aperture body to the aperture opening arranged at the first side of the aperture body, wherein the first transition is embodied such that it is at least partly roundish; or (ii) a second transition from the aperture body to the aperture opening arranged at the second side of the aperture body, wherein the second transition is embodied such that it is at least partly roundish.

14. The aperture unit according to claim 1, wherein at least one of: the aperture body or the aperture opening is provided with a coating.

15. The aperture unit according to claim 14, wherein the coating is formed by at least one of the following materials: gold, silver, titanium, platinum, iridium, copper, carbon and a polymer.

16. The aperture unit according to claim 1, further comprising at least one of the following features:

(i) the aperture unit has a plurality of first deposit supporting units at the first side of the aperture body; or (ii) the aperture unit has a plurality of second deposit supporting units at the second side of the aperture body.

17. The aperture unit according to claim 16, further comprising at least one of the following features:

(i) at least two of the plurality of first deposit supporting units have a different three-dimensional configuration with respect to one another; or (ii) at least two of the plurality of second deposit supporting units have a different three-dimensional configuration with respect to one another.

18. A particle beam device, comprising:

a first particle beam column, wherein the first particle beam column has at least one first particle beam generator for generating a first particle beam;

at least one first objective lens for focusing the first particle beam onto an object, wherein interaction particles or interaction radiation arise when the first particle beam impinges on the object;

at least one first aperture unit, wherein the first aperture unit is arranged in a region between the first particle beam generator and the first objective lens; and at least one detector for detecting the interaction particles or the interaction radiation, wherein the first aperture unit includes:

at least one aperture body having at least one first side and at least one second side;

at least one aperture opening allowing passage of particles from the first side of the aperture body to the second side of the aperture body, wherein the at least one aperture opening extends from the first side of the aperture body to the second side of the aperture body; and at least one deposit supporting unit that is a unit for depositing residual gas in a region of the at least one deposit supporting unit, wherein at least one of the following features is further provided:

(i) the at least one deposit supporting unit includes at least one first, three-dimensionally embodied deposit supporting unit for producing interaction particles or interaction radiation arranged at the first side of the aperture body, wherein the first deposit supporting unit projects according to at least one of: (a) into the aperture body proceeding from the first side of the aperture body or (b) in a direction opposite to the first side of the aperture body proceeding from the first side of the aperture body, and wherein the first deposit supporting unit is arranged at a distance from a first edge of the aperture opening; or (ii) the at least one deposit supporting unit includes at least one second, three-dimensionally embodied deposit supporting unit for producing interaction particles or interaction radiation arranged at the second side of the aperture body, wherein the second deposit supporting unit projects according to at least one of: (a) into the aperture body proceeding from the second side of the aperture body or (b) in a direction opposite to the second side of the aperture body proceeding from the second side of the aperture body, and wherein the second deposit supporting unit is arranged at a distance from a second edge of the aperture opening.

19. The particle beam device according to claim 18, further comprising at least one of the following features:

(i) a second particle beam column, wherein the second particle beam column has at least one second particle beam generator for generating a second particle beam;

(ii) at least one second objective lens for focusing the second particle beam onto the object; or (iii) at least one second aperture unit, wherein the second aperture unit is arranged in a region between the first particle beam generator and the first objective lens.

* * * * *

UNITED STATES PATENT AND TRADEMARK OFFICE
CERTIFICATE OF CORRECTION

PATENT NO. : 8,779,381 B2  
APPLICATION NO. : 13/200155  
DATED : July 15, 2014  
INVENTOR(S) : Matthias Lang et al.

Page 1 of 1

It is certified that error appears in the above-identified patent and that said Letters Patent is hereby corrected as shown below:

Title Page, Col. 1

The listed Assignee should read as follows:

(73) Assignee: Carl Zeiss Microscopy GmbH, Jena (DE)

Signed and Sealed this  
Seventh Day of April, 2015

Michelle K. Lee  
*Director of the United States Patent and Trademark Office*